United States Patent

Singh

Patent Number: 6,057,710
Date of Patent: May 2, 2000

[54] DIVER CIRCUIT FOR 3.3V I/O BUFFER USING 1.9V FABRICATION PROCESS

[75] Inventor: Gajendra P. Singh, Sunnyvale, Calif.

[73] Assignee: Sun Microsystems, Inc., Palo Alto, Calif.

[21] Appl. No.: 09/014,526

[22] Filed: Jan. 28, 1998

[51] Int. Cl.[7] .............................................. H03K 19/0175
[52] U.S. Cl. .................................. 326/81; 326/80; 326/68
[58] Field of Search .................................. 326/27, 17, 60, 326/80, 81, 83, 86, 121

[56] References Cited

U.S. PATENT DOCUMENTS 5,537,059  7/1996  Asahina ..................................... 326/81

OTHER PUBLICATIONS

"Dynamic Dielectric Protection For I/O Circuits Fabricated in a 2.5V CMOS Technology Interfacing to a 3.3V LVTTL Bus", John Connor et al., 1997 Symposium on VLSI Circuits Digest of Technical Papers.

*Primary Examiner*—Michael Tokar
*Assistant Examiner*—Anh Tran
*Attorney, Agent, or Firm*—Townsend and Townsend and Crew LLP

[57] ABSTRACT

A circuit for controlling a voltage provided to a switching transistor in a voltage conversion buffer which drives a high voltage output with low voltage transistors. The circuit has two elements to it. First, a pull-up circuit pulls the gate of the switching transistor to a high voltage level in response to a first state of a control logic signal. Second, a pull-down circuit pulls the gate of the switching transistor down to an intermediate voltage in response to a second state of the control logic signal. The intermediate voltage is set to be less than the high voltage by no more than approximately the low voltage amount.

8 Claims, 4 Drawing Sheets

DIVER CIRCUIT FOR 3.3V I/O BUFFER USING 1.9V FABRICATION PROCESS

BACKGROUND OF THE INVENTION

The present invention relates to output buffers for translating from circuitry operating at one voltage level to another voltage level, and in particular from 1.9V to 3.3V.

Transistor circuitry for logic chips will typically operate between a supply voltage and ground. One common supply voltage in the past has been 5V. More recently, circuit devices operating with a 3.3V supply have been developed, with other circuits being designed for 2.5V supplies and 1.9V supplies. Future circuits may use even lower voltage supplies.

The need for lower voltage supplies results from a number of factors. A lower voltage typically means that less power is consumed by the circuit, which is especially important in battery-operated devices. In addition, a lower voltage typically means a shorter transition time for signals, and thus faster clock speeds since the signal only needs to rise up to a lower voltage level.

A number of obvious difficulties arise in designing circuits to operate under lower voltage supplies. In particular, transistors require a certain amount of voltage to exceed their threshold and to turn on and off. As the voltage supply is lowered, the susceptibility to noise increases, since the same noise signal is a larger percentage of the data signal.

Additionally, there is a need to interface between circuits of different voltage levels. In particular, certain devices may standardize on one voltage level, while other devices may standardize on another voltage level, and they need to talk to each other. For example, a 3.3V bus has been adopted for certain computer systems. This is often adequate for the bus and certain peripheral logic chips or memory attached to the bus. However, in microprocessors, there may be a desire for lower voltage levels. In order to increase the speed in a microprocessor and reduce its power consumption while more gates are placed on it, a lower voltage supply is needed.

Buffer circuits have been designed to interface between circuitry of two different voltage levels. In interfacing between 1.9V and 3.3V, for instance, a particular difficulty arises when the transistors in 1.9V fabrication process can withstand only a voltage of 1.9V. Greater voltage levels could damage the transistors. Accordingly, the problem of driving a 3.3V output with circuitry that cannot put more than 1.9V across a transistor poses unique challenges. One approach for doing this is a cascode transistor arrangement in which the 3.3V is essentially applied across two transistors in series, with one being attached to a voltage reference to prevent too much voltage being applied to the other switching transistor. Typically, these two transistors should be connected between 3.3V and the output pad, and another two transistors connected between the output pad and ground or the low voltage reference.

SUMMARY OF THE INVENTION

The present invention provides a circuit for controlling a voltage provided to a switching transistor in a voltage conversion buffer which drives a higher voltage level output with lower voltage level transistors. The switching transistors and all the transistors in the circuit are limited by having the low voltage as a maximum voltage which can be applied across them. The circuit has two elements to it. First, a pull-up circuit pulls the gate of the switching transistor to a high voltage level in response to a first state of a control logic signal. Second, a pull-down circuit pulls the gate of the switching transistor down to an intermediate voltage in response to a second state of the control logic signal. The intermediate voltage is set to be less than the high voltage by no more than approximately the low voltage amount.

In a preferred embodiment, the pull-up circuit includes a current mirror arrangement of transistors for connecting the gate of the switching transistor to the high voltage, such as 3.3V. The current mirror circuit is coupled to ground through a first transistor having its gate controlled by a 1.9V reference voltage circuit, and a second transistor having its gate controlled by the logic signal.

In a preferred embodiment, the pull-down circuit comprises a pull-down nMOS transistor having its gate connected to an approximately 1.9V voltage reference, and a pMOS transistor connected to the source of the nMOS transistor and having its gate connected to a 1.0V voltage reference. Finally, another nMOS transistor connects the pMOS transistor to ground and is itself controlled by the inverse of the logic signal controlling the pull-up circuit.

In a further enhancement, the approximately 1.9V reference circuit controlling the rMOS transistor in the pull-down circuit can be disabled by the logic signal when the gate of the switching transistor is to be pulled up. When the gate is to be pulled down, a pull-up circuit coupled to the 3.3V supply is activated to supply sufficient voltage to the gate of the pull-down nMOS transistor (more than the 1.9V reference also connected to this gate) to quickly effect the pull-down.

For a further understanding of the nature and advantages of the invention, reference should be made to the following description taken in conjunction with the accompanying drawings.

DETAILED DESCRIPTION OF THE PREFERRED EMBODIMENTS

Figure 1:
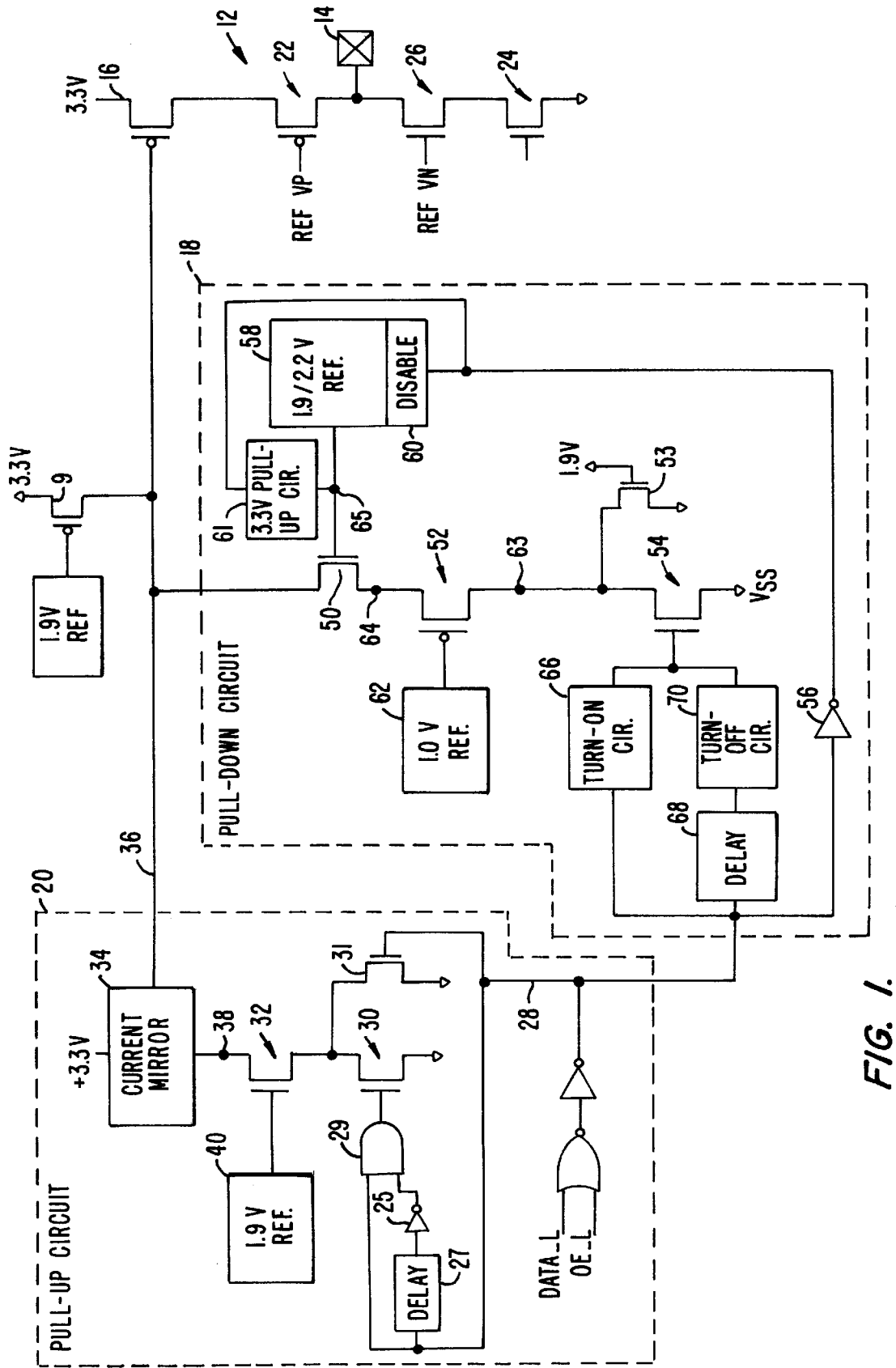
FIG. 1 is a high level diagram of the driver circuit according to one embodiment of the present invention.

FIG. 1 shows one embodiment of an output buffer according to the present invention. A cascode arrangement of transistors 12 is connected to an output pad 14, such as for connecting to a 3.3V bus. Attached to the logic high (3.3V in this case) switching transistor 16 is the driver circuit of the present invention, consisting of a pull-down circuit 18 and a pull-up circuit 20.

Transistor 16 is pMOS transistor connected to the 3.3V power supply. It is also connected to another pMOS transistor 22, which is driven by a first voltage reference VP. This voltage reference ensures that neither transistor 16 nor 22 will have more than 1.9V across it. These two transistors are used for driving a logic high (3.3V) output to pad 14. For driving a logic low output, a switching transistor 24 is connected to ground or the low voltage supply, $V_{ss}$. Another transistor 26 is connected to a separate voltage reference VN, again to protect transistors 24 and 26 from having more than 1.9V across them. Circuitry for controlling REF VP and REF VN to achieve the desired effects described is set forth in my co-pending application Ser. No. 09/014,527, entitled process compensated output driver with slew rate control.

The circuitry of the present invention, in response to a desired logic low output, will turn off transistor 16 by pulling up its gate to near the high voltage level, 3.3V. Similarly, when it is desired to drive a logic high output, transistor 16 is turned on by pulling down its gate. However, the gate must not be pulled down so much that more than 1.9V are applied across transistor 16. Accordingly, the gate must go no lower than 1.4V (for a 3.3V supply). Pull-down circuit 18 accomplishes this result. In order to achieve the high switching speeds desired, in excess of 150 Mhz, the circuit of the present invention must also be very quick.

Pull-Up Circuit

Pull-up circuit 20 responds to the control logic signal on line 28. Line 28 drives the gate of a control transistors 30 and 31, which are connected to another control or clamping transistor 32 which connects to a current mirror circuit 34. The current mirror transistor circuit will provide the current to the gate of transistor 16 on line 36. Transistor 32 is included because, without it, when current mirror 34 is turned off, node 38 would be pulled up to close to 3.3V, imposing too great of a voltage across transistor 30. Accordingly, transistor 32 "saves" transistors 30 and 31 from having too much voltage applied.

Transistor 32 is controlled by a 1.9V reference circuit 40. The use of this reference voltage level, and the appropriate sizing of transistors 30, 31, 32 and the transistors in current mirror 34 avoid any transistor having too much voltage applied across it. Although a 1.9V reference is shown, it should be understood that any voltage near this level could be used, such a 2.0V reference circuit, or a 2.2V reference circuit.

The circuit of FIG. 1 is preferably included in a semiconductor chip, such as a microprocessor, having most of its circuitry driven by a 1.9V supply voltage. 3.3V is also separately supplied to allow the transition to the outside world. Preferably, 1.9V reference circuit 40 has its voltage derived from the 3.3V supply. This ensures that if the 1.9V supply were interrupted, the transistors would not be burned out if the 3.3V was still applied. By deriving the 1.9V from the 3.3V supply, it insures that 1.9V reference circuit 40 will not lose power unless the 3.3V supply also loses power, thus ensuring that 3.3V won't be applied across the transistors upon failure of the 1.9V reference. A preferred embodiment of a circuit 40 is set forth in my co-pending application Ser. No. 09/014,527, entitled process compensated output driver with slew rate control filed even date herewith and incorporated herein by reference.

Figure 2:
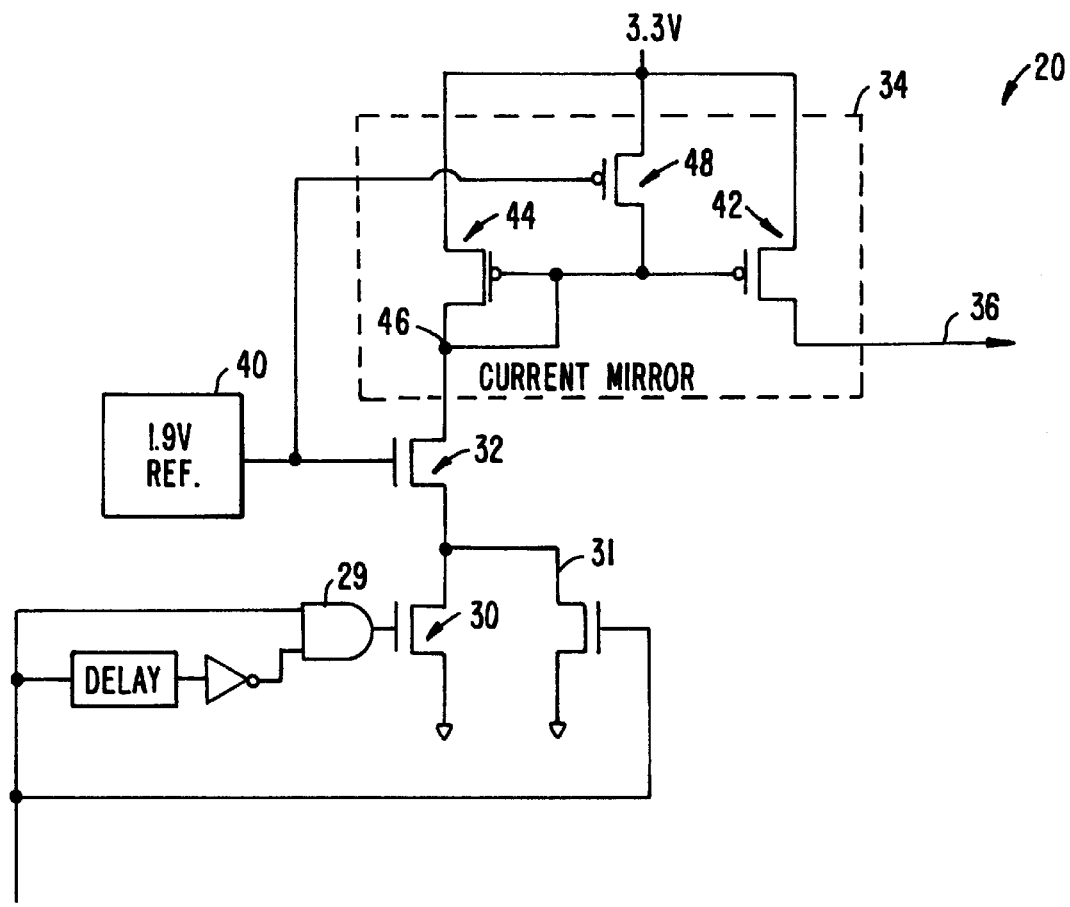
FIG. 2 is a circuit diagram of the pull-up circuit of FIG. 1.

FIG. 2 illustrates pull-up circuit 20 in some more detail. In particular, current mirror 34 is shown as including a pMOS transistor 42 having its gate coupled to the gate of a pMOS transistor 44. In operation, when line 28 is low, near zero, transistor 30 is turned off and no current flows. When line 28 transitions to a high voltage, near 1.9V, transistor 30 turns on, allowing current to flow, thus turning on transistor 44. When transistor 44 turns on, the current is mirrored through transistor 42, bringing line 36 up to near 3.3V. When control line 28 goes low again, transistor 30 will turn off, shutting off the current. Transistor 44 will drag node 46 to 3.3V−$V_T$, thus shutting itself off. Transistor 32 prevents this entire 3.3V from being applied across transistor 30.

Transistor 30 is controlled by line 28 through a control circuit consisting of AND gate 29, delay circuit 27 and inverter 25. When line 28 goes to logic high (1.9V), the gates of transistors 30 and 31 go high (1.9V) immediately. However, the gate of transistor 30 goes low after a delay determined by the delay of delay circuit 27, thus switching off transistor 30. Transistor 31 continues to be ON, though. This arrangement saves unnecessary current through transistor 30 once node 36 has reached 3.3V. To drive node 36 to 3.3V quickly, transistor 42 needs to be ON strongly. But once node 36 has reached 3.3V, transistor 42 is not needed to be ON strongly. However, it needs to hold node 36 at 3.3V against any coupling noise. Transistor 31 is sized so that it keeps transistor 42 ON sufficiently.

A pMOS transistor 48 is connected between the gates of transistors 44 and 42 and the 3.3V supply, with its gate connected to the 1.9V reference circuit 40. A leakage current through transistor 48 will slowly pull node 46 the rest of the way up to about 3.3V. This ensures proper switch off of transistor 42, and prevents its crowbarring with the pull down circuitry 18.

Pull-Down Circuit

Returning to FIG. 1, pull-down circuit 18 includes an nMOS transistor 50, a control, clamping pMOS transistor 52 and a control transistor 54. Transistor 50 is included to protect transistors 52 and 54 from having too much voltage applied across them when node 36 is pulled high. A 1.9V reference circuit 58 provides the voltage needed at the gate of transistor 50 so it can provide it's protection function (Alternately, circuit 58 could be any other voltage reference circuit near 1.9V, such as a 2.2V reference circuit, or a 2.0V reference circuit).

To turn on switching transistor 16, its gate, node 36, needs to be pulled down desirably to about 1.4V. This is done by applying 1.9V (logic high) at the gate of transistor 54, which turns on, thus drawing current from node 36. However, the path from node 36 to Vss consists of nMOS transistor 50, pMOS transistor 52 and nMOS transistor 54. So the speed with which node 36 can be pulled down depends on the current driving capability of transistors 50, 52 and 54.

Since transistor 50 is connected in source-follower configuration, its driving capability will increase if its source is pulled down. To pull down the source (node 64) of nMOS transistor 50 quickly, pMOS transistor 52 needs to conduct fast. But with 1.9V on the gate (node 65) of nMOS 50 and hence 1.9V−$V_T$ on its source, the driving capability of transistor 52 is very small.

Alternately, the current driving capability of nMOS transistor 50 can be increased by pulling its gate higher than 1.9V (or 2.0 or 2.2 V). This is feasible because the gate of nMOS transistor 54 would have 1.9V on it at this time, and thus it is secured from overstress. Pulling the gate of nMOS transistor 50 higher not only speeds up nMOS 50, but also pMOS transistor 52 because node 64 is pulled up, hence giving more Vgs to pMOS transistor 52.

Node 64 will initially be pulled up by transistor 50, thus allowing good conduction in transistor 52 due to the raised Vgs value. Node 64 will then be pulled down because of current discharge to Vss through transistors 52 and 54. The minimum voltage of node 64 is controlled by the gate voltage of transistor 52 (1.0V reference).

Figure 4:
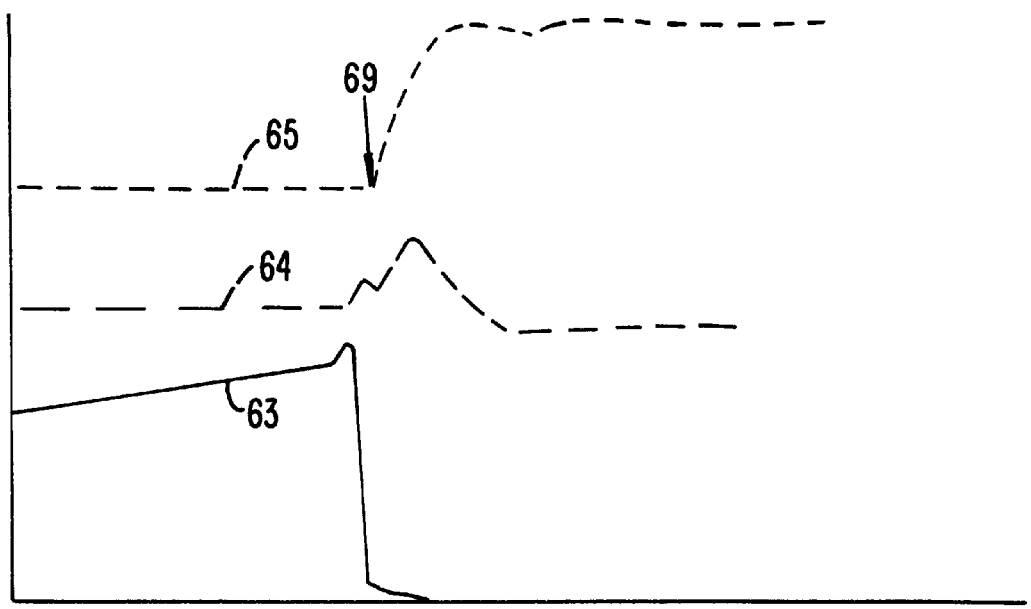
FIG. 4 is a graph illustrating the voltages at certain nodes in the pull-down circuit of FIG. 3.

This is illustrated in FIG. 4. By pulling node 65 up quickly to 3.3V, node 64 will originally rise slightly, following node 65 up. As node 64 moves up, transistor 52 turns more fully on, and then node 64 will drop because of good conduction of transistor 52, and node 63 will quickly drop as transistor 52 quickly turns on. With transistor 52 fully on, node 64 will be at the gate voltage of transistor 52, 1.0V,+Vt,=1.4V (if Vt=0.4V). Line 36 is thus quickly brought to near 1.4V, which is the desired low level to be applied to the gate of transistor 16 to limit the voltage across it to less than 1.9V. A leakage transistor 9 is connected to line 36 and the 3.3V supply to balance the off state leakage of transistor 52.

Circuit 58, with its disable circuitry 60, can be similar to that of circuit 40, referenced above and described in a copending application referred to above. 1.0V reference circuit 62 can be similarly constructed with the voltage picked off at a different level. Both circuit 62 and 58 are preferably derived from the 3.3V power supply for the reasons set forth above, to ensure no failure unless the 3.3V supply is also removed.

Figure 5:
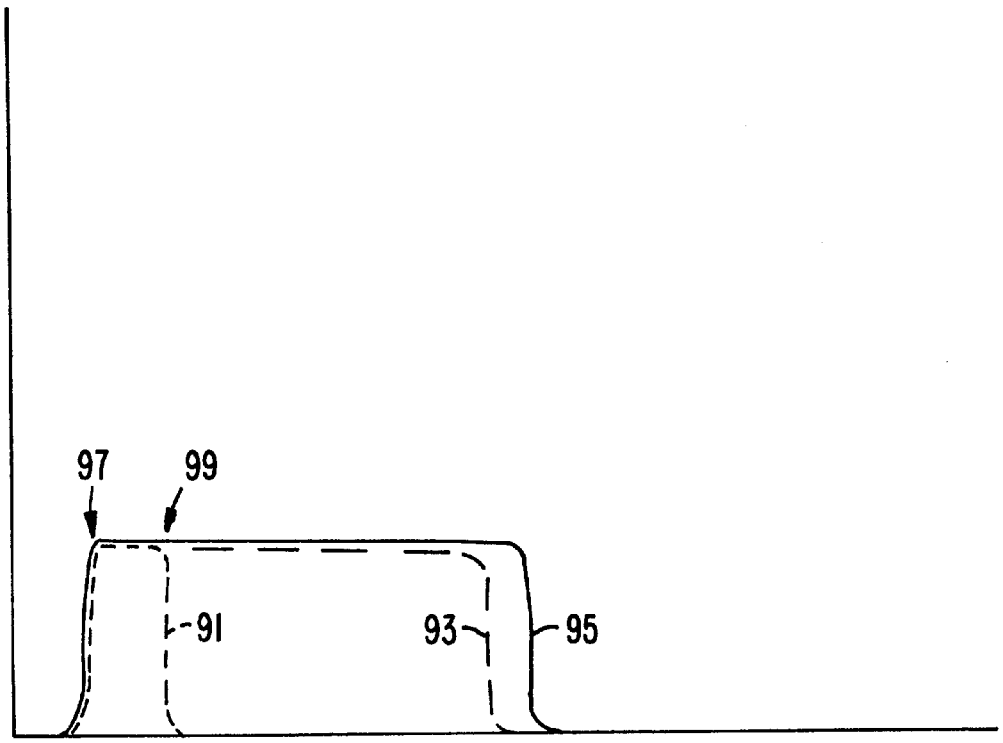
FIG. 5 is a graph illustrating delay circuit waveforms in the circuit of FIG. 3.

In operation, for quick switching times, transistor 54 is quickly turned on by the control logic through inverter 56 and a turn-on circuit 66. However, when node 36 is to be pulled up, and a discharge branch consisting of transistors 50, 52 and 54 are to be turned off and node 64 is to be pulled down back to 1.9/2.0V, it is desirable to leave transistor 54 on for a sufficient time so that nodes 64 and 63 do not charge up again to a voltage which would stress transistor 54 as node 65 decides the voltage at node 64. This is accomplished by using a delay circuit 68 before the control signal reaches a turn-off circuit 70 controlling the gate of transistor 54. Turn-on circuit 66 and turn-off circuit 70 provide a NAND gate function, with inputs before and after delay circuit 68. This is illustrated in FIG. 5, which shows node 93, connected to the gate of transistor 87, going low to turn off pull-up circuit 61. A delay later, node 95, connected to the gate of transistor 54, turns off transistor 54. A very weak transistor 53 is added so that node 63 does not pick up noise to be returned to a high voltage when transistor 54 is off.

Figure 3:
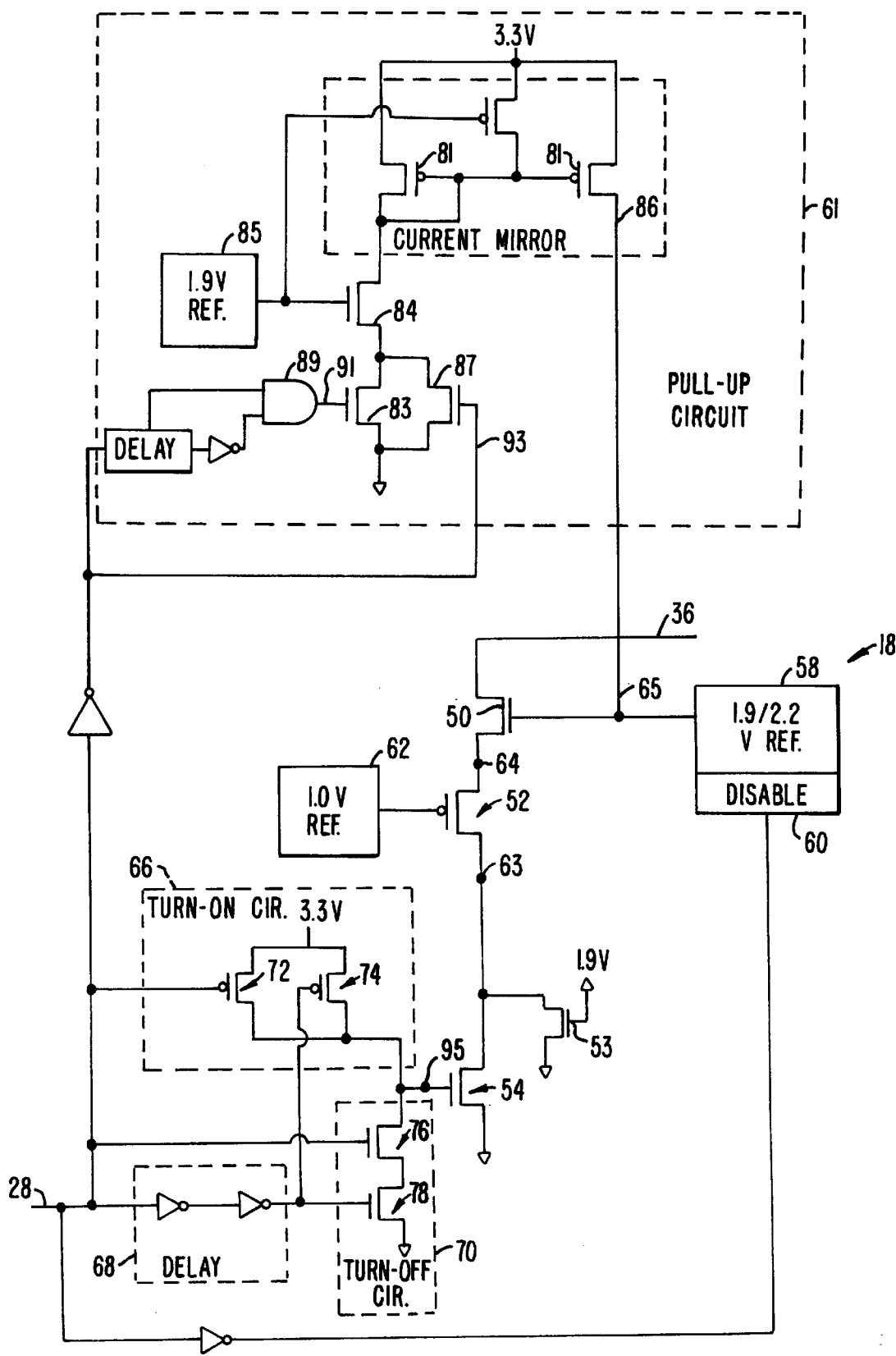
FIG. 3 is a circuit diagram of the pull-down circuit of FIG. 1.

FIG. 3 illustrates pull-down circuit 18 of FIG. 1 in more detail. Pull-up circuit 61 is similar to pull-up circuit 20 of FIG. 2. A pair of current mirror transistors 80, 81 are controlled by control transistors 83 and 87, with a transistor 84 providing protection. The gate of transistor 84 is connected to a 1.9V reference circuit, preferably a safe 1.9V derived from the 3.3V supply. An output node 86 connects to the gate of transistor 50.

Transistor 83 is a large transistor so that it can quickly turn on transistor 81. In order to reduce power consumption, once transistor 81 is quickly turned on, transistor 83 is turned off by delay circuit 88 connected to AND gate 89, with smaller transistor 87 being left on. This is shown in FIG. 5 with transistors 83 and 87 being turned on at a time 97, and then transistor 83 being turned off a short delay later at time 99, with node 91 at the gate of transistor 83 going low, while node 93 at the gate of transistor 87 stays high.

FIG. 3 also shows the internal transistors in the turn-on and turn-off circuits and the delay circuit. As can be seen, turn-on circuit 66 consists of two pMOS transistors 72 and 74 connected in parallel to the gate of transistor 54. Either one of these turning on will turn on transistor 54. The gates of transistors 72 and 74 are connected to the input and output of delay circuit 68.

The turn-off circuit consists of two series connected nMOS transistors 76 and 78. Similarly, transistor 76 has its gate connected before delay circuit 68 and transistor 78 has its gate connected after delay circuit 68. Both of transistors 76 and 78 need to be on to turn off transistor 54.

Thus, as can be seen, upon a control logic signal to turn on transistor 54, transistor 72 is immediately activated to turn it on. When the control logic dictates a turn-off, however, transistor 76 is activated immediately, but cannot turn off transistor 54 since it is in series with transistor 78. Transistor 78 is not turned on until after a delay through delay circuit 68. Transistor 76 is present so that on a turn-on condition, this leg can be immediately disabled at the same time that transistor 72 turns on, preventing it from draining current that transistor 72 is trying to provide to the gate of transistor 54. Similarly, upon transitioning to a turn-off condition, if transistor 76 is enabled and transistor 72 is turned off and transistor 74 were not present, the gate of transistor 54 would float. Accordingly, transistor 74 is connected to the output delay circuit to ensure that it is provided with current until such time that transistor 78 can turn on to take over control of the gate. This delay ensures that transistor 54 is on when the gate of transistor 50 is coming down from 3.3V to 1.9V (or 2.0V) after circuit 61 has been shut off. When transistor 54 is turned off, a small transistor 53 provides a small leakage current to prevent node 63 from charging up due to noise.

As will be understood by those with skill in the art, the present invention may be embodied in other specific forms without departing from the spirit or a sense of characteristics thereof. Accordingly, the foregoing description is intended to be illustrative, but not limiting, of the scope of the invention which is set forth in the following claims.

What is claimed is:

1. A circuit for controlling a voltage provided to a switching transistor in a voltage conversion buffer, said voltage buffer driving a high voltage output with low voltage transistors connected to a low voltage, said circuit comprising:

a first pull-up circuit including
   at least one pull-up transistor coupling a gate of said switching transistor to said high voltage,
   at least one pull-up control transistor coupled to said pull-up transistor and having a gate connected to receive a voltage signal of no more than said low voltage; and a pull-down circuit including a pull-down transistor coupled to said gate of said switching transistor, and at least one pull-down control transistor coupled to said pull-down transistor, and configured to limit a voltage applied to said gate of said switching transistor to an intermediate voltage to limit the voltage across said switching transistor to said low voltage;

wherein said pull-down transistor has a gate coupled to a first voltage reference circuit generating a first voltage substantially similar to said low voltage, and said at least one pull-down control transistor includes
   a first transistor coupled to said pull-down transistor and having its gate coupled to a second voltage reference circuit generating a voltage at least a $V_T$ lower than said first voltage; and
   a second transistor coupled between said first transistor and a low voltage reference and having a gate coupled to a logic control line;

a turn-on circuit, for turning on said first transistor, coupled between said logic control line and said gate of said second transistor;

a turn-off circuit, for turning off said first transistor, coupled to said gate of said second transistor; and a delay circuit coupled between said logic control line and said turn-off circuit.

2. The circuit of claim 1 wherein said pull-down transistor is an NMOS transistor, said first transistor is a PMOS transistor, and said low voltage reference is ground.

3. A circuit for controlling a voltage provided to a switching transistor in a voltage conversion buffer, said voltage buffer driving a high voltage output with low voltage transistors connected to a low voltage, said circuit comprising:

a first pull-up circuit including
at least one pull-up transistor coupling a gate of said switching transistor to said high voltage,
at least one pull-up control transistor coupled to said pull-up transistor and having a gate connected to receive a voltage signal of no more than said low voltage; and a pull-down circuit including
a pull-down transistor coupled to said gate of said switching transistor, and
at least one pull-down control transistor coupled to said pull-down transistor, and configured to limit a voltage applied to said gate of said switching transistor to an intermediate voltage to limit the voltage across said switching transistor to said low voltage;

a second pull-up circuit coupled to a gate of said pull-down transistor and coupled to said high voltage;

a voltage reference circuit coupled to said gate of said pull-down transistor; and a disable circuit coupled to said voltage reference circuit, said disable circuit being controlled by said logic control line to disable said voltage reference circuit when said second pull-up circuit is enabled.

4. The circuit of claim 3 wherein:
said at least one pull-up transistor comprises a current mirror; and
said at least one pull-up control transistor comprises
a first transistor coupled to said current mirror and having its gate coupled to a voltage reference circuit generating a voltage substantially similar to said low voltage, and
a second transistor coupled between said first transistor and a low voltage reference and having a gate coupled to a logic control line.

5. The circuit of claim 3 wherein said low voltage is 1.9 volts and said high voltage is 3.3 volts.

6. A circuit for controlling a voltage provided to a switching transistor in a voltage conversion buffer, said voltage buffer driving a high voltage output with low voltage transistors connected to a low voltage, said circuit comprising:

a pull-up circuit including
a pair of transistors connected as a current mirror coupling a gate of said switching transistor to said high voltage,
a first voltage reference circuit generating a first voltage substantially similar to said low voltage,
a first control transistor coupled to said current mirror and having its gate coupled to said first voltage reference circuit, and
a second control transistor coupled between said first control transistor and a low voltage reference and having a gate coupled to a logic control line; and a pull-down circuit including
a second voltage reference circuit generating a second voltage substantially similar to said low voltage,
a pull-down nMOS transistor coupled to said gate of said switching transistor, said pull-down transistor having a gate coupled to said second voltage reference circuit,
a third control transistor coupled to said pull-down transistor and having its gate coupled to a third voltage reference circuit generating a voltage at least a VT lower than said second voltage, said third control transistor being a pMOS transistor, and a fourth control transistor coupled between said first transistor and a low voltage reference and having a gate coupled to a logic control line.

7. A method for driving a high voltage output with low voltage transistors connected to a low voltage comprising:

providing a control logic signal in a range of said low voltage;

enabling a pull-up to said high voltage of a gate of a switching transistor in response to a first state of said control logic signal; and enabling a pull-down to an intermediate voltage of said gate of said switching transistor in response to a second state of said control logic signal, said intermediate voltage being less than said high voltage by no more than approximately said low voltage;

wherein said enabling a pull-down includes
switching on an nMOS transistor coupled to said gate of said switching transistor;
switching on a pMOS transistor coupled to a source of said nMOS transistor; and
providing a voltage approximately one VT less than said intermediate voltage to a gate of said pMOS transistor;

wherein said step of enabling a pull-down further includes
switching on a pull-up circuit coupled to a gate of said nMOS transistor and coupled to said high voltage; and
switching off a voltage reference circuit coupled to said gate of said nMOS transistor.

8. A computer system comprising:
a memory;
a bus coupled to said memory;
a microprocessor coupled to said bus, said microprocessor having a circuit for driving a high voltage output with low voltage transistors connected to a low voltage, including
a circuit for controlling a voltage provided to a switching transistor in a voltage conversion buffer, said voltage buffer driving a high voltage output with low voltage transistors connected to a low voltage, said circuit comprising:
a first pull-up circuit including
at least one pull-up transistor coupling a gate of said switching transistor to said high voltage,
at least one pull-up control transistor coupled to said pull-up transistor and having a gate connected to receive a voltage signal of no more than said low voltage; and
a pull-down circuit including
a pull-down transistor coupled to said gate of said switching transistor, and
at least one pull-down control transistor coupled to said pull-down transistor, and configured to limit a voltage applied to said gate of said switching transistor to an intermediate voltage to limit the voltage across said switching transistor to said low voltage;
a second pull-up circuit coupled to a gate of said pull-down transistor and coupled to said high voltage;
a voltage reference circuit coupled to said gate of said pull-down transistor; and
a disable circuit coupled to said voltage reference circuit, said disable circuit being controlled by said logic control line to disable said voltage reference circuit when said second pull-up circuit is enabled.

* * * * *

UNITED STATES PATENT AND TRADEMARK OFFICE
CERTIFICATE OF CORRECTION

PATENT NO.   : 6,057,710
DATED        : May 2, 2000
INVENTOR(S)  : gajendra P. Singh It is certified that error appears in the above-indentified patent and that said Letters Patent is hereby corrected as shown below:

Title page, item [54] and col. 1, line 1, replace "DIVER" with --DRIVER--.

Signed and Sealed this

Twentieth Day of March, 2001

Attest:

NICHOLAS P. GODICI

*Attesting Officer*   Acting Director of the United States Patent and Trademark Office